United States Patent
Wang et al.

(10) Patent No.: US 9,397,315 B2
(45) Date of Patent: Jul. 19, 2016

(54) ORGANIC LIGHT EMITTING DISPLAY DEVICE AND MANUFACTURING METHOD THEREOF

(71) Applicant: Samsung Display Co., Ltd., Yongin-si, Gyeonggi-do (KR)

(72) Inventors: Seong Min Wang, Suwon-si (KR); Mu Gyeom Kim, Yongin-si (KR); Gug Rae Jo, Asan-si (KR); Dae Young Lee, Seoul (KR); Jung Gun Nam, Seoul (KR); Dae Hwan Jang, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/954,856

(22) Filed: Jul. 30, 2013

(65) Prior Publication Data
US 2014/0291622 A1    Oct. 2, 2014

(30) Foreign Application Priority Data
Mar. 28, 2013    (KR) .......................... 10-2013-0033214

(51) Int. Cl.
*H01L 29/08*    (2006.01)
*H01L 51/52*    (2006.01)

(52) U.S. Cl.
CPC .................................. *H01L 51/5281* (2013.01)

(58) Field of Classification Search
CPC .................................. H01L 33/22; H01L 33/12
USPC ............................................................. 257/40
See application file for complete search history.

(56) References Cited

U.S. PATENT DOCUMENTS

| | | | |
|---|---|---|---|
| 2004/0113166 A1* | 6/2004 | Tadatomo et al. | 257/98 |
| 2005/0077820 A1* | 4/2005 | Onishi | H01L 51/5262 313/506 |
| 2007/0157839 A1* | 7/2007 | Kim et al. | 101/483 |
| 2007/0284567 A1* | 12/2007 | Pokrovskiy | G02F 1/133603 257/13 |
| 2009/0302750 A1* | 12/2009 | Jun et al. | 313/504 |
| 2010/0068419 A1 | 3/2010 | Kim et al. | |
| 2011/0121327 A1 | 5/2011 | Lee et al. | |
| 2011/0186894 A1* | 8/2011 | Kim | 257/98 |
| 2011/0266577 A1 | 11/2011 | Kim et al. | |
| 2012/0319122 A1* | 12/2012 | Ma | 257/72 |
| 2014/0030830 A1* | 1/2014 | Lee et al. | 438/29 |

FOREIGN PATENT DOCUMENTS

| | | |
|---|---|---|
| KR | 10-2004-0101004 | 12/2004 |
| KR | 10-2008-0095207 | 10/2008 |
| KR | 10-2010-0078354 | 7/2010 |
| KR | 10-2011-0134174 | 12/2011 |

* cited by examiner

*Primary Examiner* — Trung Q Dang
*Assistant Examiner* — Patricia Reddington
(74) *Attorney, Agent, or Firm* — Lewis Roca Rothgerber Christie LLP

(57) ABSTRACT

An organic light emitting display device includes a substrate comprising a first side and a second side, a first electrode on the first side of the substrate, an emitting layer on the first electrode, a second electrode on the emitting layer, and a slit-shaped pattern at the second side of the substrate, and comprising a plurality of protrusions spaced apart from each other.

16 Claims, 8 Drawing Sheets

ORGANIC LIGHT EMITTING DISPLAY DEVICE AND MANUFACTURING METHOD THEREOF

CROSS-REFERENCE TO RELATED APPLICATION

This application claims priority to and the benefit of Korean Patent Application No. 10-2013-0033214, filed on Mar. 28, 2013, with the Korean Intellectual Property Office, the present disclosure of which is incorporated herein in its entirety by reference.

BACKGROUND

1. Field

The present disclosure relates to an organic light emitting display device capable of preventing deterioration of visibility due to external light by forming a slit-shaped pattern on a substrate, and a manufacturing method thereof.

2. Description of Related Art

An organic light emitting display device is a self-emission display device that has an organic light emitting diode that emits light to display an image. In general, the organic light emitting display device has a structure in which a display unit 20 is formed on a substrate 10, as illustrated in FIG. 1. The display unit 20 includes a first electrode 21 and a second electrode 23 for injecting a hole and an electron, respectively, and also includes an emitting layer 22 between the first electrode 21 and the second electrode 23. In the organic light emitting display device, a hole supplied from a hole injection electrode (the first electrode), and an electron supplied from an electron injection electrode (the second electrode), are coupled with each other in the emitting layer to form an exciton, and light is generated by energy generated when the formed exciton falls to a ground state.

The organic light emitting display device may be classified as a top emission type, or as a bottom emission type, depending on the direction in which the light generated from the emitting layer is displayed. The bottom emission type refers to a structure in which light passes through a substrate to be displayed, and the top emission type refers to a structure in which light is displayed at an opposite side of the substrate. FIG. 1 illustrates an example of the bottom emission type organic light emitting display device.

In the organic light emitting display device, a polarizer POL 40 is at the side of the emission surface to prevent visibility from deteriorating due to light incident from the outside. The polarizer 40 polarizes the light incident from the outside, and thus suppresses or reduces reflection of the light, which has been incident to the inside of the organic light emitting display device, to the outside. As a result, the effect of decrease of contrast ratio (CR) due to external light may be reduced. Meanwhile, when the polarizer is used, a tri-acetyl cellulose (TAC) film for supporting the polarizer, and adhesives 61 and 62, such as an optically clear adhesive (OCA) for bonding the polarizer to the substrate 10 or a window 50, are used.

As such, when the polarizer is used, a thickness of the organic light emitting display device may be increased by using the TAC film and the adhesive.

SUMMARY

Aspects of the present disclosure provide an organic light emitting display device that provides a slit-shaped pattern on a side of a substrate, which serves as a polarizer.

The present disclosure provides an organic light emitting display device of which the entire thickness is decreased because no polarizer is used.

The present disclosure provides a manufacturing method of an organic light emitting display device in which a slit-shaped pattern is provided on a side of a substrate.

According to one aspect of the present disclosure, there is provided an organic light emitting display device including: a substrate including a first side and a second side; a first electrode on the first side of the substrate; an emitting layer on the first electrode; a second electrode on the emitting layer; and a slit-shaped pattern at the second side of the substrate, and including a plurality of protrusions spaced apart from each other.

The light generated from the emitting layer may pass through the substrate.

The second electrode may include a reflective material.

The protrusions may extend in a general direction, and a cross section of one of the protrusions in the general direction may have a quadrangular shape or a U-lettered shape.

A height of one of the protrusions may be about 100 nm to about 200 nm, and a width of one of the protrusions may be about 30 nm to about 100 nm.

A distance between adjacent ones of the protrusions may be about 60 nm to about 250 nm.

Each of the protrusions may include metal or metal oxide.

The metal may include at least one of aluminum (Al), chrome (Cr), or silver (Ag).

Each of the protrusions may include a metal layer.

Each of the protrusions further includes a black matrix layer on the metal layer.

The black matrix layer covers a surface of the metal layer.

The black matrix layer includes metal oxide.

The metal oxide includes at least one of aluminum oxide, chrome oxide, or silver oxide.

According to another embodiment of the present invention, there is provided a manufacturing method of an organic light emitting display device, the method including: forming a slit-shaped pattern having a plurality of protrusions that are spaced from each other on a first side of a substrate; forming a first electrode on a second side of the substrate; forming an emitting layer on the first electrode; and forming a second electrode on the emitting layer.

The forming of the slit-shaped pattern may include using metal or metal oxide to form the protrusion.

The forming of the slit-shaped pattern may include: forming a metal layer on the substrate; and forming a protrusion including metal by imprinting the metal layer.

The forming of the slit-shaped pattern may include: forming a plurality of metal protrusions that are spaced apart from each other using metal; and forming a black matrix layer on the metal protrusions.

The black matrix layer may include metal oxide.

The forming the black matrix layer may include anodizing the metal protrusion.

According to an embodiment of the present disclosure, an organic light emitting display device includes a slit-shaped pattern on one side of a substrate, which serves as a polarizer. As a result, a polarizer and a TAC film conventionally used in the organic light emitting display device are not required, which decreases the entire thickness of the organic light emitting display device.

According to an embodiment of the present disclosure, the organic light emitting display device may be manufactured without using a polarizer, and as a result, it is possible to manufacture a slimmer device. Further, because the polarizer is not used, thickness may be reduced, flexibility may be increased, and durability for bending may be improved. As a result, embodiments of the present disclosure may improve the manufacture of flexible organic light emitting display devices.

The foregoing summary is illustrative only, and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
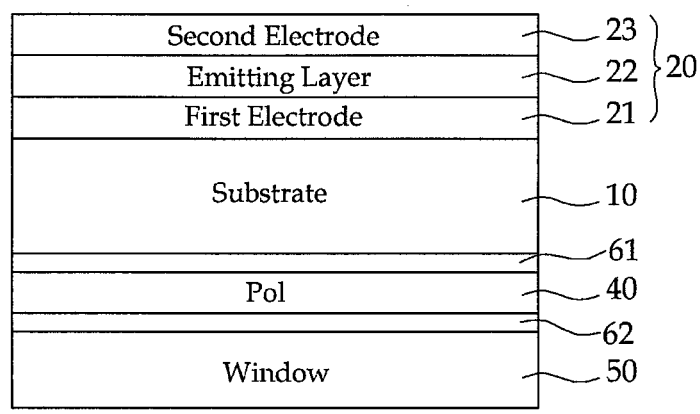
FIG. 1 is a schematic diagram illustrating an example of a general organic light emitting display device.

Hereinafter, the present disclosure will be described in detail based on embodiments illustrated in the drawings. However, the scope of the present disclosure is not limited to the drawings, or to the embodiments to be described below. The accompanying drawings are simply selected and illustrated as examples for describing the present disclosure in detail among various embodiments.

Respective components and shapes in the drawings may be schematically drawn or exaggeratedly drawn for ease of understanding, and some components in a real product might not be illustrated, and descriptions thereof might not be provided. Therefore, the drawings should be analyzed to help in understanding the present disclosure. Meanwhile, like reference numerals designate components playing the same role in the drawings.

It will be understood that when a layer or an element is described as being "on" another layer or element, it may be directly positioned (or located or located) on another layer or element, or one or more intervening layers and/or elements may also be present.

Figure 2:
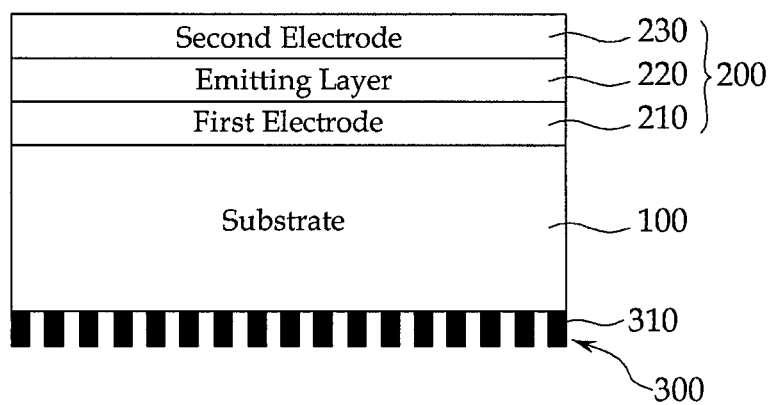
FIG. 2 is a schematic diagram for describing an example of an organic light emitting display device, according to an embodiment of the present disclosure.

As illustrated in FIG. 2, an organic light emitting display device, according to an embodiment of the present disclosure, includes a display unit 200 on one side of a substrate 100, and a slit-shaped pattern 300 on the other side of the substrate 100. Here, the display unit 200 includes a first electrode 210 on one side of the substrate 100, an emitting layer 220 on the first electrode 210, and a second electrode 230 on the emitting layer 220. Further, the slit-shaped pattern 300 includes a plurality of protrusions 310 that are separated from each other (e.g., by regular intervals).

In the organic light emitting display device illustrated in FIG. 2, light generated from the emitting layer 220 is displayed by passing through the substrate 100. Thus, FIG. 2 illustrates a bottom emission type organic light emitting display device. The slit-shaped pattern 300 is located at a display direction side. Accordingly, the slit-shaped pattern 300 extends along a side of the substrate that is opposite to the emitting layer 220.

Hereinafter, the bottom emission type organic light emitting display device of the present embodiment will be described, and examples will be described in which the slit-shaped pattern 300 is at a side of the substrate that is opposite to a side of the substrate facing the second electrode 230 and the emitting layer 220.

The organic light emitting display device illustrated in FIG. 2 includes the substrate 100, the first electrode 210 on one side of the substrate 100, the emitting layer 220 on the first electrode 210, the second electrode 230 on the emitting layer 220, and the slit-shaped pattern 300 at the other side of the substrate 100 and including the plurality of protrusions 310 spaced apart from each other.

In the organic light emitting display device illustrated in FIG. 2, the second electrode 230 may be formed as a reflective electrode. For example, the second electrode 230 may be formed by using LiF/Al to provide the reflective characteristic.

The first electrode 210 may have a light transmission property. For example, the first electrode 210 may be formed by using ITO, IZO, ZnO, and/or $In_2O_3$ to be able to transmit light. As such, the first electrode 210 may be formed as a transparent electrode.

Figure 3:
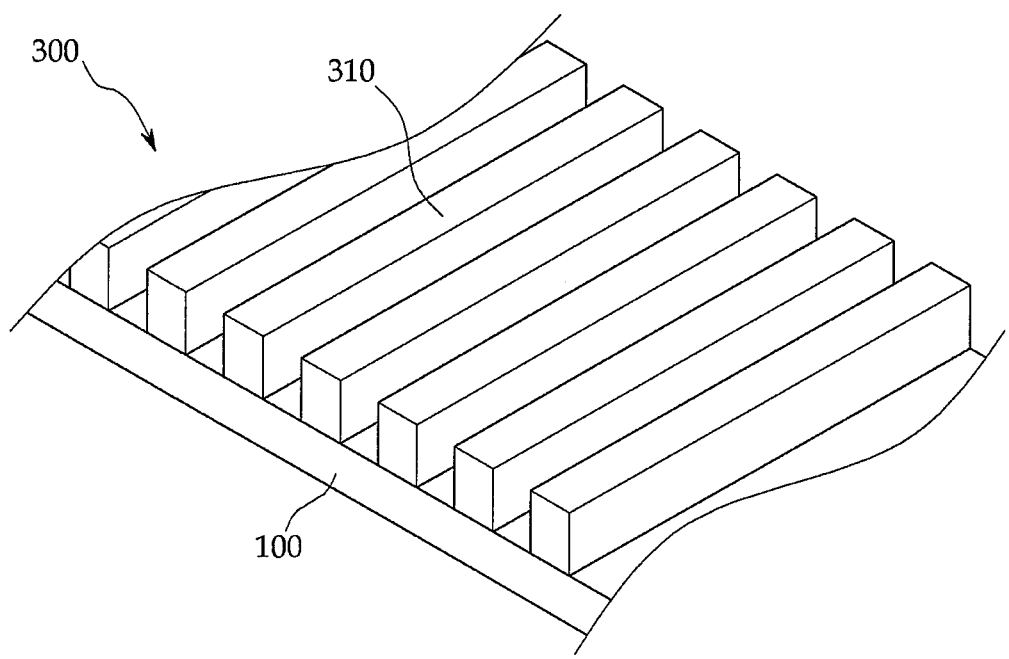
FIG. 3 is a perspective view schematically illustrating a structure of a slit-shaped pattern formed on a substrate in an organic light emitting display device, according to an embodiment of the present disclosure.

FIG. 3 schematically illustrates a perspective view of a structure of the slit-shaped pattern 300 formed on the substrate 100. As illustrated in FIG. 3, each of the plurality of protrusions 310 spaced apart from each other is formed in a long rod/stripe shape, and is positioned to be spaced from each other to collectively form a slit pattern.

As illustrated in FIG. 3, the pattern 300 has a plurality of slits, and the slit-shaped pattern 300 may serve as a polarizer by controlling, or adjusting, a distance, or pitch, p (see FIG. 4A) between the protrusions 310 that configure the slit-shaped pattern (e.g., a distance p from a leftmost edge of one protrusion to a leftmost edge of an adjacent protrusion), that is, by controlling a size of the distance (or, a gap) between the protrusions 310.

The respective protrusions 310 comprising the slit-shaped pattern 300 may be formed in various suitable shapes. A cross-sectional shape of the protrusion 310 is not particularly limited. For example, the cross section of the protrusion 310 may be a quadrangle, as illustrated in FIG. 3, or may be a U-lettered shape.

The slit-shaped pattern 300 may made of various suitable materials. For example, the respective protrusions 310 comprising the slit-shaped pattern 300 may be formed by various suitable materials, and may be made of conductive materials or non-conductive materials. Further, the protrusion 310 may or may not be reflective.

The protrusions 310 may include, for example, at least one of metal and metal oxide, such as, for example, aluminum (Al), chrome (Cr), silver (Ag), and/or the like.

To absorb outside light incident on the inside of the organic light emitting display device, and thus to prevent the reflection of external light, a portion of the protrusions 310, on which the external light may be incident, may be made of a material not having a light reflective property, such as a light absorptive material.

Figure 4A:
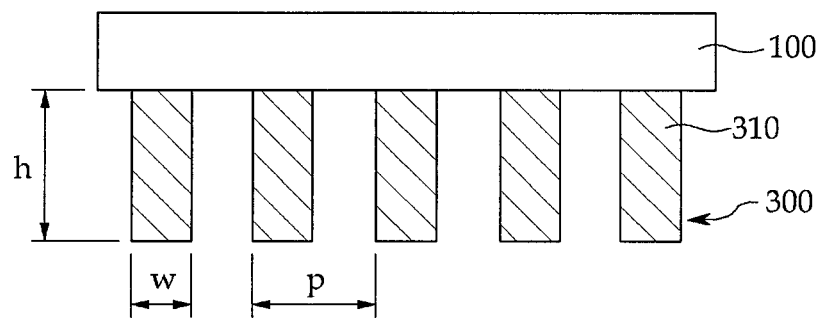
FIGS. 4A to 4C illustrate examples of a structure of a slit-shaped pattern formed on a substrate in an organic light emitting display device, according to some embodiments of the present disclosure.
Figure 4B:
Figure 4C:

FIGS. 4A to 4C illustrate examples of a structure of a slit-shaped pattern formed on a substrate in the organic light emitting display device, according to some embodiments of the present disclosure.

FIG. 4A illustrates an example in which the protrusion 310 is rectangular. The protrusion 310 may include a metal layer, and may even be formed by only the metal layer. Further, the protrusion 310 may be formed by a light absorptive material, which may be, for example, metal oxide such as aluminum oxide (AlOx), chrome oxide (CrOx), silver oxide (AgOx), and/or the like.

According to other embodiments of the present disclosure, a black matrix layer 322/332 may be formed on the metal layer 321/331 (e.g., see FIGS. 4B and 4C). Because metal is generally reflective, the black matrix layer 322/332 is located on the metal layer 321/331 to absorb light incident from the outside. In such an embodiment, the black matrix layer 322/332 extends along a direction in which external light is incident (e.g., in a direction that is perpendicular to the substrate 100).

FIG. 4B illustrates another example embodiment of the slit-shaped pattern 300. In FIG. 4B, a protrusion 320 comprises two layers. For example, the protrusion 320 includes a metal layer 321 formed at a lower layer part, and a black matrix layer 322 on the metal layer 321. In FIG. 4B, the black matrix layer 322 is laminated on the metal layer 321.

The protrusion 320 illustrated in FIG. 4B may be manufactured by forming the metal layer 321 on the substrate using metal, and by then forming the black matrix layer 322 on the metal layer 321. The black matrix layer 322 may be formed of, for example, metal oxide.

FIG. 4C illustrates yet another example embodiment of the slit-shaped pattern 300. The structure of a protrusion 330 in FIG. 4C has a form in which the black matrix layer 332 covers a surface of the metal layer 331. As an example of a method for forming the protrusion 330, a method of anodizing a surface of a metal protrusion after forming the metal protrusion using metal can be applied. An interior of the protrusion 330 is the metal layer 331, and an outer surface of the metal layer is oxidized by the anodizing to generate metal oxide, thus forming the black matrix layer 332.

As such, the black matrix layers 322 and 332 may be formed by metal oxide, which may include, for example, aluminum oxide, chrome oxide, or silver oxide.

According to an embodiment of the present disclosure, the metal layer may be formed by aluminum (Al), and the black matrix layer may be formed by aluminum oxide. A metallic material applied to form the metal layer, and a metallic material applied to the metal oxide, may or may not be the same as each other.

According to an embodiment of the present disclosure, the slit-shaped pattern 300 may serve as a polarizer. Widths w and heights h of the protrusions 310, 320, and 330, and a distance p between the protrusions (e.g., a distance between corresponding edges of adjacent protrusions), may be controlled/designed so that the slit-shaped pattern 300 serves as the polarizer.

The widths w and the heights h of the protrusions 310, 320, and 330, and the distance p may be determined within ranges of a width, a height, and a distance of slits in a polarizer using linear polarization. Particularly, the distance p corresponding to the spacing of the protrusions 310, 320, and 330 is important for polarization, and the distance p may be differently adjusted according to a wavelength. According to an embodiment of the present disclosure, when visible light passes through the slit-shaped pattern 300, the polarization is performed.

In general, if the distance p corresponding to a space between adjacent ones of the protrusions 310, 320, and 330 is too small, light does not pass, while if the distance p is too large, the polarization is not performed well. As will be understood by those skilled in the art, the distance p may be designed/adjusted so that the polarization is performed.

When the distance p between adjacent ones of the protrusions 310, 320, and 330 comprising the slit-shaped pattern 300 is too large, the gap ("gap=p−w", see FIG. 4A) between the protrusions 310, 320, and 330 becomes larger than a wavelength of incident light, and thus the polarization is not performed well. In addition, when the distance between the protrusions 310, 320, and 330 is excessively decreased, the light may not pass through the slit-shaped pattern 300.

As a result, in an embodiment of the present disclosure, a distance (e.g., pitch, represented by "p" in FIG. 4A) between the adjacent protrusions 310, 320, and 330 may be in a range of about 60 nm to about 250 nm.

To provide a sufficient path so that the incident light is polarized, the heights h of the protrusions 310, 320, and 330 are set to be about 100 nm or more. The heights h of the protrusions 310, 320, and 330 are adjusted to be about 200 nm or less to promote slimness of the display device, and to prevent the light from being lost when passing through the protrusions 310, 320, and 330.

When the widths w of the protrusions 310, 320, and 330 are too small, the protrusions may not function as slits, and when the widths w of the protrusions 310, 320, and 330 are too large, light generated in the display unit may excessively be blocked. As a result, in an embodiment of the present disclosure, the widths w of the protrusions 310, 320, and 330 may be set in a range of about 30 nm to about 100 nm.

As such, in the organic light emitting display device, according to an embodiment of the present disclosure, the slit-shaped pattern 300 including the plurality of protrusions replaces the polarizer. As a result, the organic light emitting display device may be manufactured without using a conventional polarizer, thereby enhancing slimness of the device. Further, because the conventional polarizer is not used, overall thickness may be reduced, flexibility may be increased, and durability of tensile and compression stress for bending may be improved. As a result, embodiments of the present disclosure may improve the manufacture of flexible organic light emitting display devices.

Figure 5:
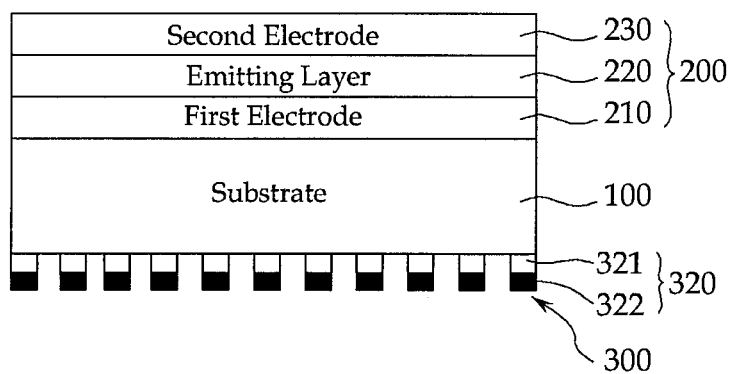
FIG. 5 schematically illustrates a structure of an organic light emitting display device, according to an embodiment of the present disclosure.

FIG. 5 illustrates a structure of an organic light emitting display device, according to another embodiment of the present disclosure. The present embodiment includes the slit-shaped pattern 300 having the protrusions 320 illustrated in FIG. 4B.

Figure 6:
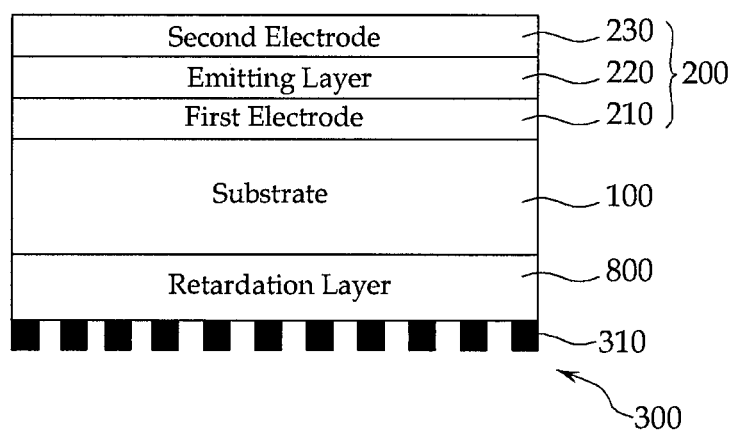
FIG. 6 schematically illustrates a structure of an organic light emitting display device, according to another embodiment of the present disclosure.

FIG. 6 illustrates a structure of an organic light emitting display device according to yet another embodiment of the present disclosure. Here, a retardation layer 800 is interposed between the substrate 100 and the slit-shaped pattern 300. The retardation layer 800 changes a phase of light to as to produce destructive interference of light.

An embodiment of the present disclosure provides a manufacturing method of an organic light emitting display device. The manufacturing method may include forming a slit-shaped pattern 300 on one side of the substrate 100, and forming a display unit 200 on the other side of the substrate 100.

In detail, a manufacturing method of the organic light emitting display device, according to the present embodiment, includes forming a slit-shaped pattern 300 including a plurality of protrusions 310 spaced from each other on one side of the substrate 100, forming a first electrode 210 on the other side of the substrate 100, forming an emitting layer 220 on the first electrode 210, and forming a second electrode 230 on the emitting layer 220.

Figure 7:
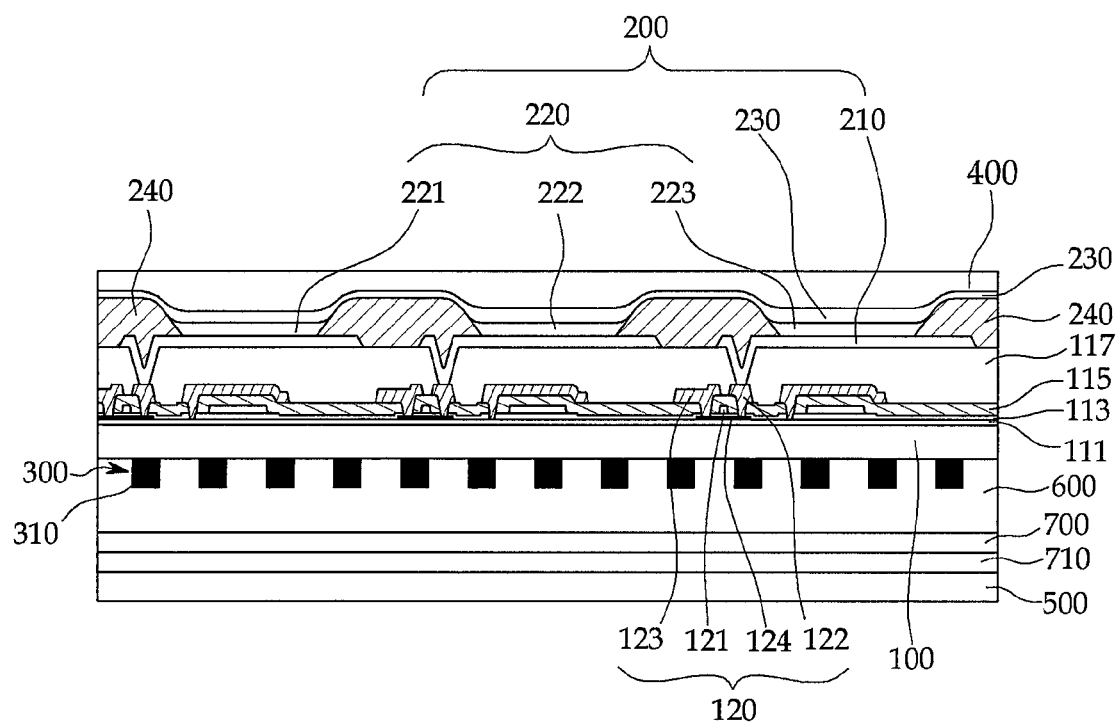
FIG. 7 is a schematic diagram illustrating a structure of an organic light emitting display device, according to an embodiment of the present disclosure in more detail.

FIG. 7 illustrates an organic light emitting display device, according to an embodiment of the present disclosure, in more detail. In the example embodiment illustrated in FIG. 7, a bottom emission type organic light emitting display device is exemplified, in which light generated from the emitting layer 220 is displayed on the substrate 100 side.

A manufacturing method and a detailed structure of the organic light emitting display device, according to an embodiment of the present disclosure, will be described with reference to FIG. 7.

First, the substrate 100 may use, for example, glass or polymer plastic, which is generally used in the organic light emitting display device. The substrate 100 may be transparent. The substrate 100 may be properly selected and used, as will be understood by those of ordinary skill in the art.

The display unit 200 is formed on one side of the substrate 100, and the slit-shaped pattern 300 is formed on the other side of the substrate 100. Hereinafter, first, the forming of the display unit 200 will be described, and subsequently, the forming of the slit-shaped pattern 300 will be described. As will be recognized by those of ordinary skill in the art, the order of the following description may not reflect the temporal order of steps during an actual manufacturing process.

To form the display unit 200 of the present embodiment, first, the first electrode 210 is formed on the substrate 100. A plurality of thin film transistors 120 may be formed on the substrate 100 before forming the first electrode 210. The thin film transistor 120 of the present embodiment includes a gate electrode 121, a drain electrode 122, a source electrode 123, and a semiconductor layer 124, which are formed on the substrate 100. Further, a gate insulating layer 113 and an interlayer insulating layer 115 may be formed on the thin film transistor 120. The structure of the thin film transistor 120 is not limited to the form illustrated in FIG. 7, and may be configured in other forms. A buffer layer 111 made of silicon oxide, silicon nitride, and/or the like may be further included between the thin film transistor 120 and the first substrate 100.

In the embodiment illustrated in FIG. 7, the first electrode 210 corresponds to an anode as a pixel electrode that is electrically coupled (e.g., electrically connected) with the thin film transistor 120, while the second electrode 230 corresponds to a cathode as a common electrode.

The first electrode 210 is electrically coupled (e.g., electrically connected) with the thin film transistor 120. In this embodiment, when a planarization layer 117 covering the thin film transistor 120 is provided, the first electrode 210 is located on the planarization layer 117. The first electrode 210 may be electrically coupled (e.g., electrically connected) with the thin film transistor 120 through a contact hole provided in the planarization layer 117.

In the bottom emission type organic light emitting display device of the present embodiment, the first electrode 210 is formed as a transparent electrode. The first electrode may be formed of, for example, ITO, IZO, ZnO, or $In_2O_3$.

In the example of FIG. 7, the first electrode 210 serves as an anode and the second electrode 230 serves as a cathode, although polarities of the first electrode 210 and the second electrode 230 may be reversed in other embodiments.

A pixel defining layer (PDL) 240 is provided between adjacent ones of the first electrodes 210. The pixel defining layer 240 is made of a material having an insulation property to partition the first electrodes 210 according to a pixel unit. The pixel defining layer 240 is located at an edge of the first electrode 210 to partition the first electrodes by a pixel unit, thereby defining pixel areas. The pixel defining layer 240 may cover the edge/edges of the first electrode 210.

The emitting layer 220 is formed on the first electrode 210, and is formed in a pixel area that is an opening on the first electrode 210 partitioned by the pixel defining layer 240. The emitting layer 220 includes, for example, a red emitting layer 221, a green emitting layer 222, and a blue emitting layer 223.

Although not illustrated in the drawing, at least one of a hole injection layer and a hole transport layer may also be located between the first electrode 210 and the emitting layer 220.

The second electrode 230 is formed on the emitting layer 220. The second electrode 230 may be made of a material which is generally used in the art. The second electrode 230 may be provided as a transparent electrode or a reflective electrode. When the second electrode 230 is formed as the transparent electrode, the second electrode 230 may have, for example, a structure including a first layer made of Li, Ca, LiF/Ca, LiF/Al, Al, Mg or a compound thereof, and a second layer made of a material for forming a transparent electrode such as ITO, IZO, ZnO, and/or $In_2O_3$ on the first layer. When the second electrode 230 is formed as the reflective electrode, the second electrode 230 may be formed by, for example, depositing Li, Ca, LiF/Ca, LiF/Al, Al, Mg, or a mixture thereof.

In the bottom emission type organic light emitting display device of the present embodiment, the second electrode 230 may be manufactured as the reflective electrode. For example, the second electrode 230 may be made of LiF/Al.

Although not illustrated in the drawing, at least one of an electron injection layer and an electron transport layer may also be located between the emitting layer 220 and the second electrode 230.

A passivation layer 400 may be formed on the second electrode 230, and may include a capping layer or an encapsulation layer.

The slit-shaped pattern 300 including the plurality of protrusions 310 spaced apart from each other is provided on the other side of the substrate 100. The shape and the structure of the slit-shaped pattern 300 are described above.

A planarization layer 600 is located on the slit-shaped pattern 300 to planarize the upper side (e.g., the bottom side in FIG. 7) of the plurality of protrusions 310. The planarization layer 600 may be a passivation layer.

A window 500 is located above (e.g., below in FIG. 7) the planarization layer 600. Further, a touch panel 700 for touch input may be located between the window 500 and the planarization layer 600. Further, an adhesive layer 710 may be used to attach the touch panel 700 to the window 500.

In forming the slit-shaped pattern 300, the protrusion 310 may be formed by using at least one of metal and metal oxide.

Figure 8A:
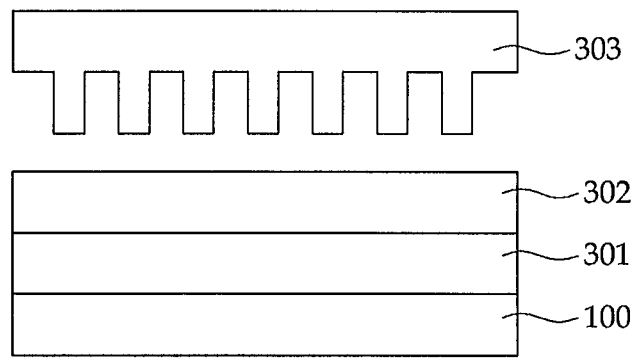
FIGS. 8A to 8C are schematic diagrams for describing a process of forming a slit-shaped pattern on a substrate, according to an embodiment of the present disclosure.
Figure 8B:
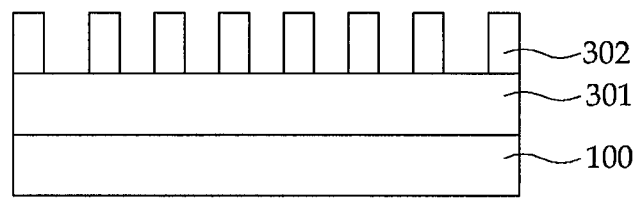
Figure 8C:
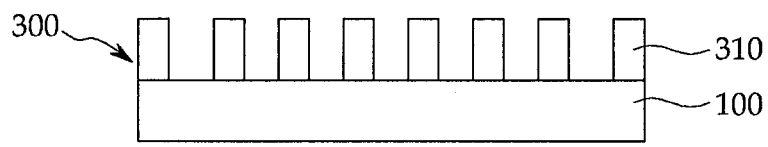

FIGS. 8A to 8C illustrate an example of a process of forming the slit-shaped pattern 300, according to an embodiment of the present invention. The forming of the slit-shaped pattern 300 may include forming a metal layer 301 on the substrate 100, and forming the protrusion 310 made of metal by imprinting the metal layer 301.

First, as illustrated in FIG. 8A, the metal layer 301 is formed on the substrate 100, and a photoresist 302 is located on the metal layer 301. Next, a pattern is formed on the photoresist 302 by using an imprinter 303 having a pattern. As a result, the pattern illustrated in FIG. 8B is formed of the photoresist 302.

Next, as illustrated in FIG. 8C, by selectively etching the metal layer 301 by using the photoresist pattern, the plurality of protrusions 310 are formed, and thus, the slit-shaped pattern 300 is formed.

FIGS. 9A to 9E illustrate another example of a process of forming the slit-shaped pattern 300, according to an embodiment of the present invention.

Figure 9A:
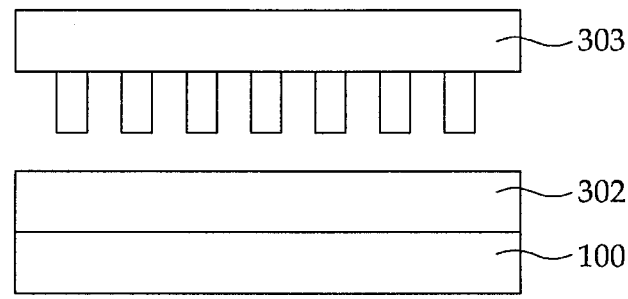
FIGS. 9A to 9E are schematic diagrams for describing a process of forming a slit-shaped pattern on a substrate, according to another embodiment of the present disclosure.
Figure 9B:
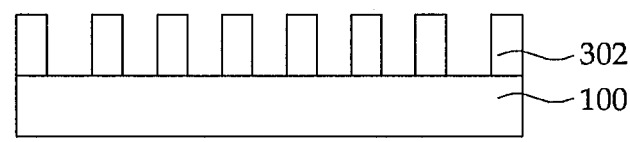

First, as illustrated in FIG. 9A, the photoresist 302 is located on the substrate 100, and a pattern is formed on the photoresist 302 by using the imprinter 303 having a pattern. As a result, a photoresist 302 pattern illustrated in FIG. 9B is formed.

Figure 9C:
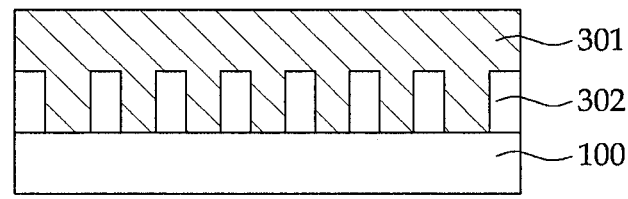
Figure 9D:
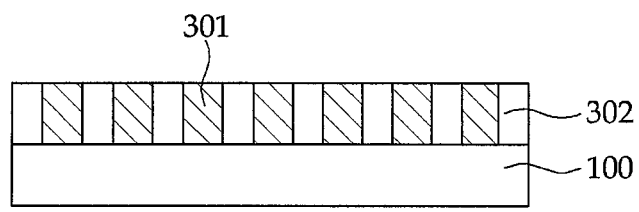
Figure 9E:
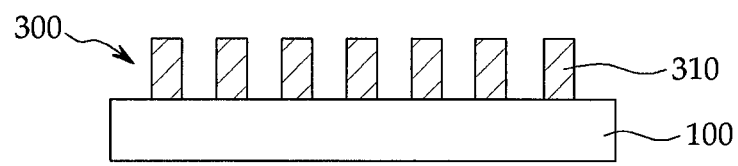

Next, the metal layer 301 is formed, as can be seen in FIG. 9C, by filling metal on the pattern formed by the photoresist 302. The metal layer 301 is carved, or eroded, to be a same height of the photoresist 302 pattern (e.g., a height from the substrate 100) by chemical mechanical polishing (CMP), as can be seen in FIG. 9D. Finally, as can be seen in FIG. 9E, by stripping the photoresist pattern, only the protrusion 310 made of metal remains.

As described in FIGS. 4B and 4C, a black matrix layer may thereafter be formed on the protrusion 310 made of metal.

For example, the forming of the slit-shaped pattern 300 may include forming a plurality of metal protrusions 310 spaced apart from each other by using metal, and forming a black matrix layer on the metal protrusion 310.

The black matrix layer may be formed by metal oxide. As illustrated in FIG. 4B, the black matrix layer 322 may be formed by laminating metal oxide on the metal protrusion 321.

Further, the black matrix layer may be formed by anodizing the metal protrusion 310. In detail, after forming the metal protrusion 310 by the method illustrated in FIGS. 8A to 8C or in FIGS. 9A to 9E, the black matrix layer may be formed by anodizing the metal protrusion 310. As a result, a slit-shaped pattern 300 including the protrusion 330 of FIG. 4C may be formed, in which the inside of the protrusion 330 is the metal protrusion 331 made of metal, and in which the black matrix layer 332 is formed on the surface of the metal protrusion 331.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims and equivalents thereof.

What is claimed is:

1. An organic light emitting display device comprising:
a substrate comprising a first side and a second side, the second side being substantially and continuously flat;
a first electrode on the first side of the substrate;
an organic light emitting layer on the first electrode;
a second electrode on the organic light emitting layer; and
a slit-shaped pattern on the second side of the substrate, and comprising a plurality of protrusions spaced apart from each other, and spaces between the plurality of protrusions exposing portions of the second side of the substrate, each of the plurality of protrusions comprises a metal layer and a black matrix layer on the metal layer.

2. The organic light emitting display device of claim 1, wherein light generated from the organic light emitting layer passes through the substrate.

3. The organic light emitting display device of claim 1, wherein the second electrode comprises a reflective material.

4. The organic light emitting display device of claim 1, wherein the protrusions extend in a general direction, and
wherein a cross section of one of the protrusions in the general direction has a quadrangular shape or a U-lettered shape.

5. The organic light emitting display device of claim 1, wherein a height of one of the protrusions is about 100 nm to about 200 nm, and
wherein a width of one of the protrusions is about 30 nm to about 100 nm.

6. The organic light emitting display device of claim 1, wherein a distance between adjacent ones of the protrusions is about 60 nm to about 250 nm.

7. The organic light emitting display device of claim 1, wherein each of the protrusions comprises metal or metal oxide.

8. The organic light emitting display device of claim 1, wherein the metal layer comprises at least one of aluminum (Al), chrome (Cr), or silver (Ag).

9. The organic light emitting display device of claim 1, wherein the black matrix layer covers a surface of the metal layer.

10. The organic light emitting display device of claim 1, wherein the black matrix layer comprises metal oxide.

11. The organic light emitting display device of claim 10, wherein the metal oxide comprises at least one of aluminum oxide, chrome oxide, or silver oxide.

12. A manufacturing method of an organic light emitting display device, the method comprising:
forming a slit-shaped pattern having a plurality of protrusions that are discontinous and are spaced from each other on a first side of a substrate;
forming a first electrode on a second side of the substrate;
forming an organic light emitting layer on the first electrode; and
forming a second electrode on the organic light emitting layer,
wherein the forming of the slit-shaped pattern comprises:
forming a metal layer on the substrate;
forming a protrusion comprising metal by imprinting the metal layer; and
forming a metal oxide layer on the metal layer.

13. A manufacturing method of an organic light emitting display device, the method comprising:
forming a slit-shaped pattern having a plurality of protrusions that are discontinous and are spaced from each other on a first side of a substrate;
forming a first electrode on a second side of the substrate;
forming an organic light emitting layer on the first electrode; and
forming a second electrode on the organic light emitting layer,
wherein the forming of the slit-shaped pattern comprises:
forming a plurality of metal protrusions that are spaced apart from each other using metal; and
forming a black matrix layer on the metal protrusions by anodizing the metal protrusion.

14. The manufacturing method of an organic light emitting display device of claim 13, wherein the black matrix layer comprises metal oxide.

15. The organic light emitting display device of claim 1, further comprising a retardation layer between the substrate and the slit-shaped pattern.

16. The manufacturing method of an organic light emitting display device of claim 12, further comprising forming a retardation layer on the first side of the substrate and before forming the slit-shaped pattern.

* * * * *